(12) United States Patent
Ma

(10) Patent No.: US 7,867,004 B2
(45) Date of Patent: Jan. 11, 2011

(54) ELECTRICAL CONNECTOR WITH IMPROVED STIFFENER DEVICE

(75) Inventor: Hao-Yun Ma, Tu-cheng (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 116 days.

(21) Appl. No.: 12/381,793

(22) Filed: Mar. 17, 2009

(65) Prior Publication Data

US 2009/0233477 A1   Sep. 17, 2009

(30) Foreign Application Priority Data

Mar. 17, 2008   (TW) ............................ 97109277 A

(51) Int. Cl.
*H01R 13/62* (2006.01)
(52) U.S. Cl. ...................... 439/331; 439/701
(58) Field of Classification Search ............... 439/331, 439/330, 70, 686, 701, 342
See application file for complete search history.

(56) References Cited

U.S. PATENT DOCUMENTS 7,160,130 B2 *   1/2007   Ma ........................... 439/331

FOREIGN PATENT DOCUMENTS

CN           2760802 Y       2/2006

* cited by examiner

*Primary Examiner*—Tho D Ta
*Assistant Examiner*—Travis Chambers
(74) *Attorney, Agent, or Firm*—Andrew C. Cheng; Wei Te Chung; Ming Chieh Chang

(57) ABSTRACT

An electrical connector includes an insulative housing, a number of electrical contacts and a stiffener device surrounding housing. A load plate is mounted to one end of the stiffener device and a lever is rotatably mounted to the other end of the stiffener device. The stiffener device includes an insulative frame for cost saving and a number of metal auxiliary members for increasing intensity.

18 Claims, 4 Drawing Sheets

US 7,867,004 B2

ELECTRICAL CONNECTOR WITH IMPROVED STIFFENER DEVICE

BACKGROUND OF THE INVENTION

1. Field of the Invention

The present invention relates to an electrical connector, and more popularly to an electrical connector connecting an chip module with a printed circuit board with improved stiffener device.

2. Description of the Prior Art

FIG. 1 shows a conventional electrical connector 6 for connecting a chip module, which includes an insulative housing 60 with a plurality of electrical contacts 64 retained thereon, a stiffener 61 surrounding the insulative housing 60, a load plate 62 rotatably mounted to the stiffener 61, and a lever 63 rotatably mounted to the stiffener 61. The insulative housing 60 defines a plurality of passageways 600 extending therethrough for receiving the electrical contacts 64. The stiffener 61 and the load plate 62 are hollow and each defines a window. One end 610 of the stiffener 61 has a groove 6101 for mounting to a mating section 621 of the load plate, an the other end 611 of stiffener 61 has a mating groove 612 for retaining a shaft section 631 of lever 63 and a extending section 612 for preventing the lever 63 from falling off from the stiffener 61. Generally, the stiffener 61 is stamped from metal plate and has a much more area for securing the load plate 62 and the lever 63 thereon. Furthermore, for shaping the window of the stiffener, it is requires to remove most of the material during punching. Therefore, material waste is an issue for this type of connector.

China Patent No. CN2760802Y issued to Lotes on Feb. 22, 2006, discloses an electrical connector includes an insulative housing with contacts and a securing member on one end of the insulative housing. A load plate is pivotally mounted on the securing member for pressing a chip module to contact with the contacts. The insulative housing has a positioning device for retaining the load plate. The insulative housing needs to increase the thickness thereof for providing a good intensity for securing. In addition, the structure of the insulative housing is complicated and difficult to manufacture.

Therefore, there is need to supply an improved electrical connector.

SUMMARY OF THE INVENTION

Accordingly, an object of the present invention is to provide an electrical connector having an insulative stiffener surrounding the insulative housing thereof for cost saving.

In order to achieve the object set forth, an electrical connector comprises an insulative housing, a plurality of electrical contacts received in the insulative housing; a stiffener device surrounding the insulative housing, a load plate mounted to one end of the stiffener device, and a load lever rotatably mounted to the other end of the stiffener device. The stiffener device comprises an insulative frame and a plurality of metal auxiliary members fastened to the insulative frame. The load plate is mounted to a first auxiliary member of the stiffener device.

DESCRIPTION OF PREFERRED EMBODIMENT

Reference will now be made to the drawings to describe the present invention in detail.

Figure 1:
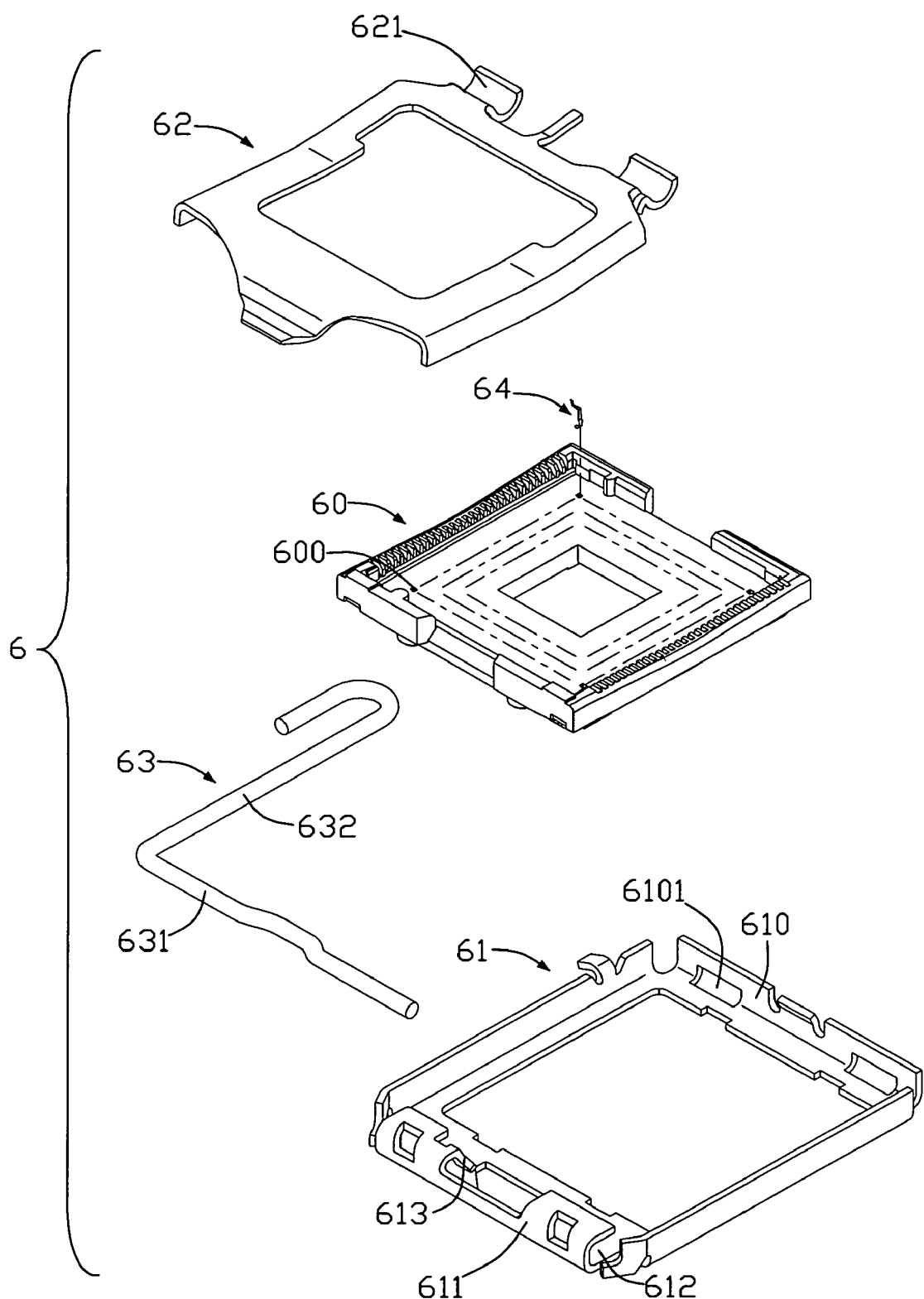
FIG. 1 is a conventional electrical connector.
Figure 2:
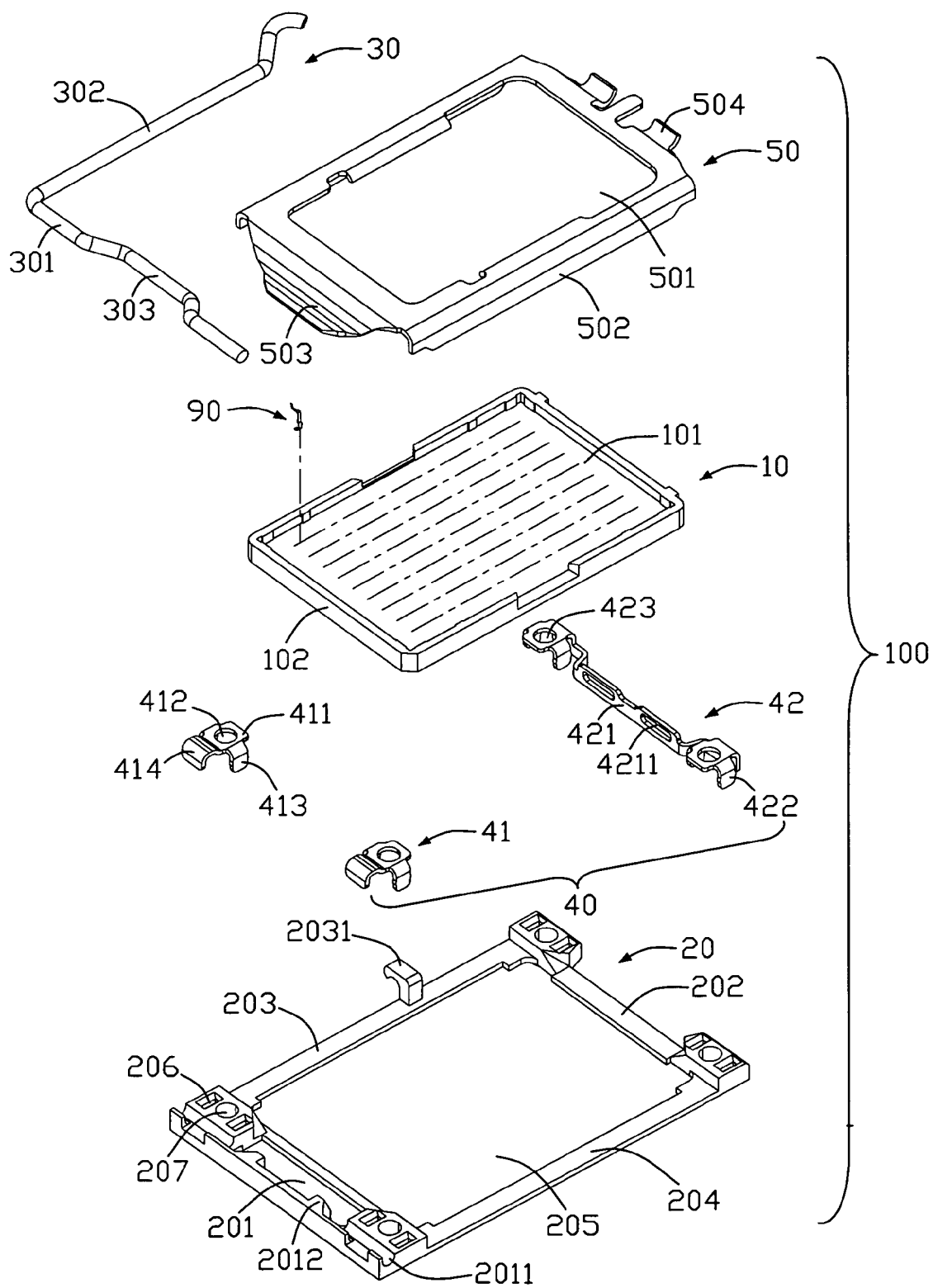
FIG. 2 is an exploded perspective view of an electrical connector according to a preferred embodiment of the present invention.

Please referring to FIG. 2, an electrical connector 100 of the present invention for connecting a chip module (not shown) with a printed circuit board (not shown) includes an insulative housing 10, a plurality of electrical contacts 90 positioned in the insulative housing 10, an insulative frame 20 surrounding the insulative housing 10, a load lever 30 mounted to one end of the insulative frame 20, a plurality of metal auxiliary member 40 secured to the insulative frame 20, and a metal load plate 50. The auxiliary members 40 include a pair of first member 41 and a second member 42. The load plate 50 is attached to the second member 42.

The insulative housing 10 is rectangular and includes a base 101 and a plurality of sidewalls 102 extending upwardly from the base 101. The base 101 defines a plurality of passageways (not labeled) for receiving the electrical contacts 90 and forming a conductive region. The electrical contacts 90 are used to contact with the chip module and the printed circuit board and establish electrical connection therebetween.

The insulative frame 20 is made of insulative material and located at outside of the insulative housing 10. The insulative frame 20 has a first end 201, a second end 202 opposite to the first end 201, and a pair of first and second side 203, 204 connected therewith, and an opening 205 located therebetween for accommodating the insulative housing 10. The first and second end 201, 202 each have a pair of slots 206 and an aperture 207 extending therethrough at each corner thereof. The first end 201 has a groove 2011 for receiving the load lever 30 and a pair of stopper 2012 projecting towards to the second end 202 for limiting the load lever 30. The first side 203 has a latch 2031 locked with the load lever 30. In other embodiments of the present invention, the frame can be a plurality of separated insulative elements.

The load lever 30 comprises a pivot section 301 sandwiched by the frame 20 and the pair of first auxiliary member 41, an operating section 302 perpendicular to the pivot section 301 and a press section 303 offsetting from the pivot section 301.

The first and second auxiliary member 41, 42 are stamped from metal plate. The first member 41 each has a flat base 411, a pair of retention tabs 413 downwardly extending from the base 411, and a spring tab 414 extending downwardly from the base 411 and located between the pair of retention tabs 413. A hole 412 is defined on the base 411 corresponding to the aperture 207 of the insulative frame 20. The second member 42 includes a main section 421 and a pair of positioning member at opposite sides thereof. The positioning member is similar to the first auxiliary member and includes a pair of retention tabs 422, a spring tab (not labeled), and a hole 423. The main section 421 defines a pair of slots 4211 and forming a pair of hinges (not labeled) for the load plate 50 pivotally mounted thereon. The auxiliary member 40 and the insulative frame 20 form a stiffener device with good intensity for the electrical connector.

The load plate 50 is a hollow frame and has a window 501. Pair of sidewalls 502 is bent downwardly from opposite sides of the window 501. The load plate 50 has a tongue 503 at one end thereof and a curve mating section 504 at the other end thereof.

Figure 3:
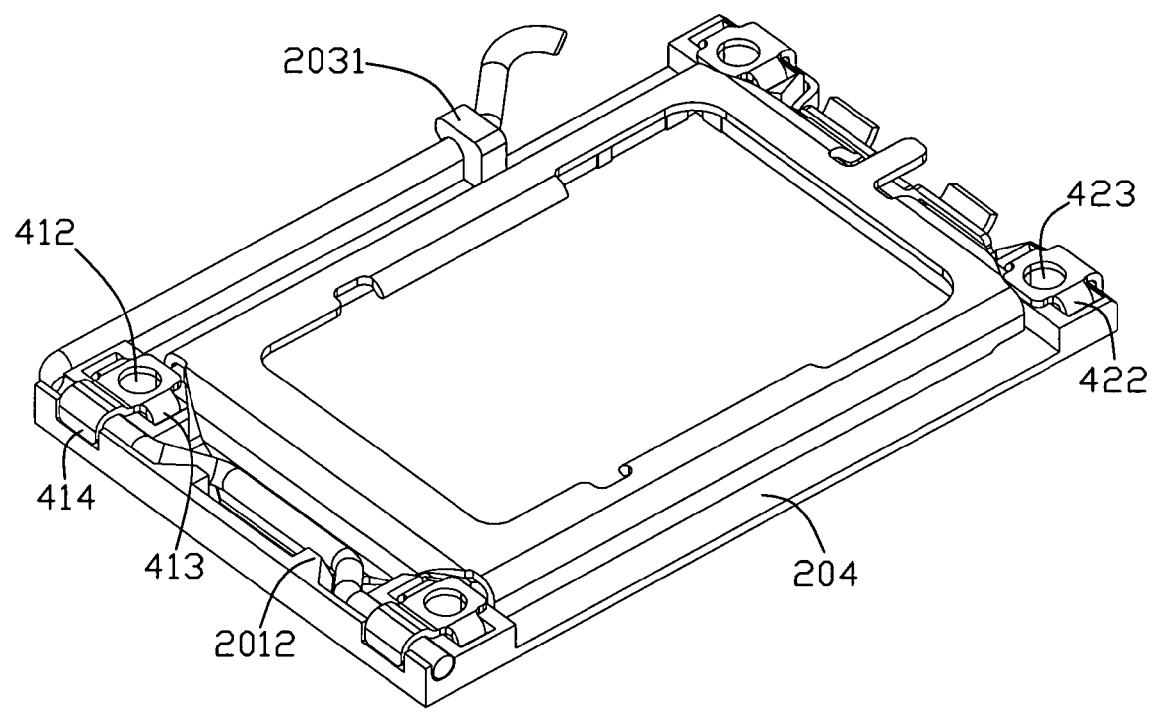
FIG. 3 is an assembly view of the electrical connector shown in FIG. 2.
Figure 4:
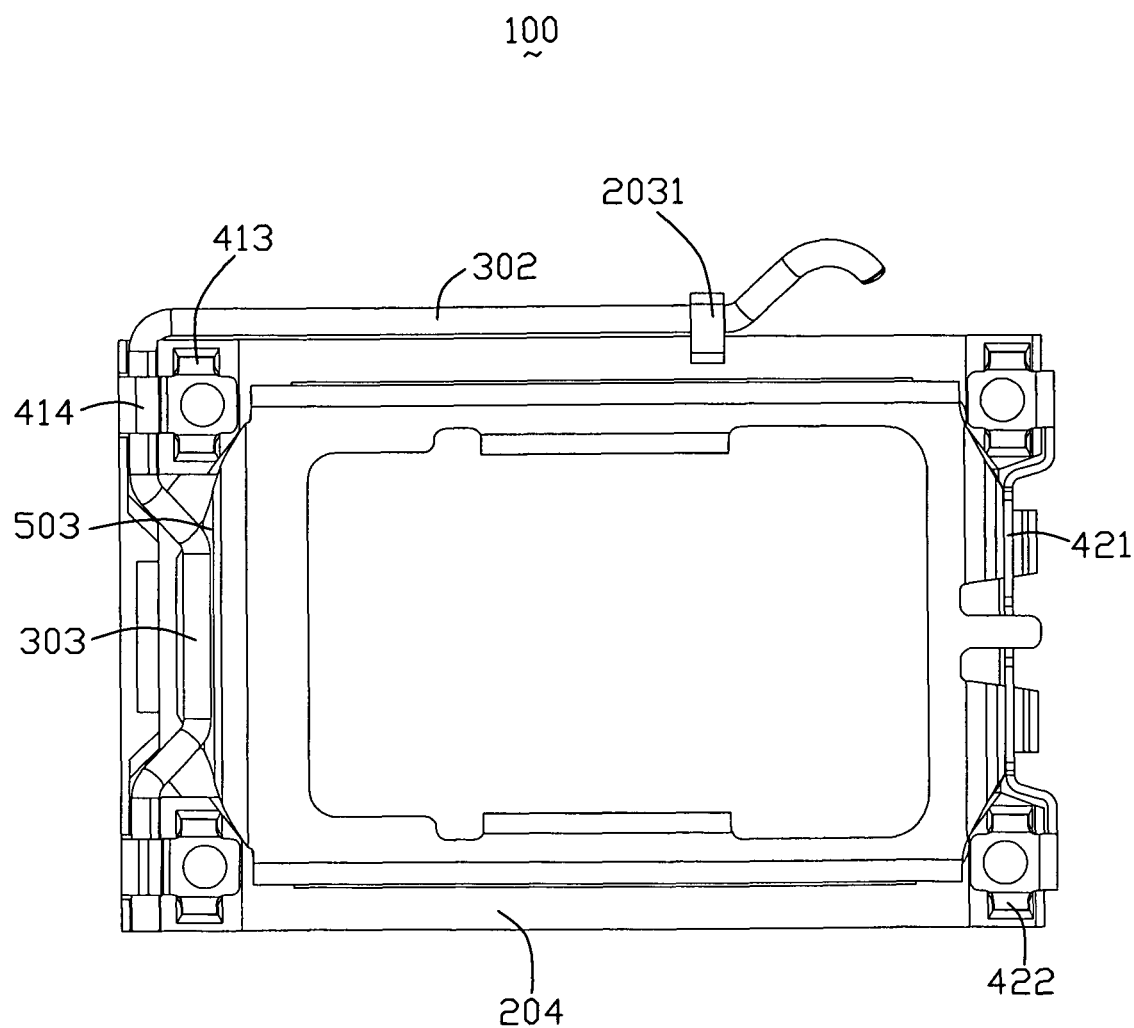
FIG. 4 is a top view of the electrical connector shown in FIG. 2.

Please referring to FIG. 2 and FIG. 3, in assembly, the insulative housing 10 is received in the opening 205 of the insulative frame 203 and engages with the insulative frame 203. The pivot section 301 is rotatably mounted to the hinges of the insulative frame 20 with the stoppers 2012 abutting against opposite sides of the press section 303 thereby preventing the lever 30 moving in the lateral direction. Then, the first and second member 41, 42 are fastened to the insulative frame 20 with the first and retention tabs 413, 422 interference with the slots 206. The load lever 30 is secured to the insulative frame 20 by the first auxiliary member 41 to provide a good fixation between the stiffener device and the load lever 50. The mating section 504 of the load plate 50 is mounted to the slots 4211 of the second member 42.

After assembly, the load plate 50 can rotate with regard to the insulative frame 20 from an open position to a closed position. At the closed position, the press section 303 of the load lever 30 is pressed on the tongue 503 of the load plate 52 and the operation section 302 is locked with the latch 2031. After the electrical contacts 90 soldering to the printed circuit board, a plurality of connecting elements (not shown) such as screw or the like can insert into the holes 412, 413, and apertures 207 for locking the electrical connector 100 on the printed circuit board.

Although the present invention has been described with reference to particular embodiments, it is not to be construed as being limited thereto. Various alterations and modifications can be made to the embodiments without in any way departing from the scope or spirit of the present invention as defined in the appended claims. For example, the housing and the frame are both insulative and may be unified together as a housing subassembly.

What is claimed is:

1. An electrical connector comprising:
   an insulative housing;
   a plurality of electrical contacts received in the insulative housing;
   a stiffener device surrounding the insulative housing and comprising an insulative frame and a plurality of metal auxiliary members fastened to the insulative frame;
   a load plate mounted to a first auxiliary member at one end of the stiffener device and rotating relative to the insulative housing from an open position to a closed position; and
   a load lever rotatably mounted to the other end of the stiffener device; wherein the load lever is sandwiched by the insulative frame and a pair of second auxiliary members.

2. The electrical connector as claimed in claim 1, wherein the load lever comprises a pivot section sandwiched by the insulative frame and the second auxiliary member, an operating section perpendicular to the pivot section and a press section offsetting from the pivot section.

3. The electrical connector as claimed in claim 1, wherein the pair of second metal member each has a pair of retention tabs interference with the insulative frame and a spring tab pressing on the load lever.

4. The electrical connector as claimed in claim 1, wherein the first auxiliary member has a pair of hinges for the load plate rotating on the stiffener device.

5. The electrical connector as claimed in claim 1, wherein the insulative frame defines a plurality of apertures extending therethrough, and the auxiliary members define a plurality of holes corresponding to the apertures.

6. The electrical connector as claimed in claim 1, wherein the insulative frame has a pair of opposite first and second end, a pair of first and second side connected with the first and second end, and an opening for accommodating the insulative housing.

7. An electrical connector comprising:
   an insulative frame comprising a plurality of sidewalls and an opening formed by the sidewalls;
   an insulative housing received in the opening of the frame with a plurality of electrical contacts secured thereon;
   a load plate pivotally mounted to one end of the insulative frame; and
   a lever pivotally mounted to the other end of the stiffener device; and
   a plurality of metal members fastened to the insulative frame and securing the load plate and the lever on the insulative frame.

8. The electrical connector as claimed in claim 7, wherein the metal members includes a pair of first member and a second member.

9. The electrical connector as claimed in claim 8, wherein the second member is provided with a pair of hinges for the load plate mounted thereon.

10. The electrical connector as claimed in claim 8, wherein the lever includes a pivot section located between the pair of first members and the insulative frame so as to rotate from an open position to a closed position with regard to the insulative housing.

11. The electrical connector as claimed in claim 10, wherein the lever further comprises an operating section perpendicular to the pivot section and a press section offsetting from the pivot section for pressing the load plate.

12. The electrical connector as claimed in claim 7, wherein the insulative frame defines a plurality of apertures at corners thereof and the apertures extend through the insulative frame in the vertical direction.

13. The electrical connector as claimed in claim 12, wherein the metal members define a plurality of holes corresponding to the holes of the insulative frame.

14. An electrical connector comprising:
   an insulative housing subassembly defining opposite longitudinal first and second ends, and equipped with a plurality of contacts, each of said contacts defining an upward extending contacting section exposed above a top face of the housing;
   a first pair of metallic auxiliary members fastened to two opposite corners at said first end of the housing subassembly and fastening a lever to said first end under condition of said lever being pivotable relative to the housing subassembly; and
   a second pair of metallic auxiliary members fastened to two opposite corners at said second end of the housing subassembly; wherein
   said second pair of metallic auxiliary members joined with each other via a main section which extends in a transverse direction perpendicular to said front-to-back direction, under condition of a load plate having one end being pivotally mounted to the main section, and the other opposite end downwardly pressed by the lever.

15. The electrical connector as claimed in claim 14, wherein the end of the load plate is exposed to an exterior along the front-to-back direction.

16. The electrical connector as claimed in claim 14, wherein said housing subassembly includes an insulative housing unit wherein the contacts are located, and a frame surrounding said housing unit.

17. The electrical connector as claimed in claim 14, wherein said main section is exposed to an exterior along the front-to-back direction.

18. The electrical connector as claimed in claim 17, wherein the lever around the first end is shielded by the housing subassembly in said front-to-back direction.

* * * * *